(12) United States Patent
Lu (10) Patent No.: US 7,858,875 B2
(45) Date of Patent: Dec. 28, 2010

(54) RADIANT ENERGY CONVERSION SYSTEM (75) Inventor: Zhenghao Jason Lu, Sunnyvale, CA (US)

(73) Assignee: Enfocus Engineering Corp., Sunnyvale, CA (US)

( * ) Notice: Subject to any disclaimer, the term of this patent is extended or adjusted under 35 U.S.C. 154(b) by 874 days.

(21) Appl. No.: 11/533,767

(22) Filed: Sep. 21, 2006

(65) Prior Publication Data

US 2007/0070531 A1   Mar. 29, 2007

Related U.S. Application Data (60) Provisional application No. 60/753,537, filed on Dec. 24, 2005, provisional application No. 60/721,645, filed on Sep. 29, 2005.

(51) Int. Cl.
*H01L 31/042* (2006.01)
*F25D 23/00* (2006.01)
*F24J 2/10* (2006.01)

(52) U.S. Cl. .................. 136/246; 136/251; 136/259; 136/248; 62/264; 126/600; 126/684

(58) Field of Classification Search ................ 136/243, 136/258, 260, 263, 264, 251, 246, 248, 259; 257/292, 293; 62/264; 126/600, 684
See application file for complete search history.

(56) References Cited

U.S. PATENT DOCUMENTS

| | | | |
|---|---|---|---|
| 4,069,812 A | 1/1978 | O'Neil | |
| 4,129,119 A * | 12/1978 | Yoke | 126/607 |
| 4,184,482 A | 1/1980 | Cohen | |
| 4,215,410 A | 7/1980 | Weslow | |
| 4,219,009 A * | 8/1980 | Palmer | 126/599 |
| 4,223,174 A | 9/1980 | Moeller | |
| 4,227,514 A * | 10/1980 | Spitzer | 126/651 |
| 4,252,107 A * | 2/1981 | Horton | 126/605 |
| 4,256,364 A | 3/1981 | Minoura et al. | |
| 4,262,161 A * | 4/1981 | Carey | 136/256 |
| 4,297,521 A * | 10/1981 | Johnson | 136/248 |
| 4,354,484 A | 10/1982 | Malone et al. | |
| 4,475,536 A * | 10/1984 | Dame | 126/585 |
| 5,665,174 A | 9/1997 | Laing | |
| 5,977,475 A | 11/1999 | Hibino | |
| 6,127,620 A | 10/2000 | Tange | |
| 6,465,725 B1 * | 10/2002 | Shibata et al. | 136/246 |

(Continued)

OTHER PUBLICATIONS

Swanson, "The Promise of Concentrators," in Prog. Photovolt. Res. Appl. vol. 8, 93-111, (2000).

(Continued)

*Primary Examiner*—Jeffrey T Barton
*Assistant Examiner*—Devina Pillay
(74) *Attorney, Agent, or Firm*—Workman Nydegger (57) ABSTRACT

A radiant energy concentrating or collimating system comprising an enclosure that shields its contents from environmental effects while allowing radiant energy to transmit through its top window; a plurality of energy concentrating or collimating assemblies, each on its own pivot mechanism and each comprising a plurality of optics, a support structure and an energy conversion device that is mounted on a heat dissipating structure; a drive mechanism controlled by a microprocessor to rotate the said energy concentrating or collimating assemblies on two orthogonal axes in unison so the assemblies are oriented towards desired direction at any given time.

35 Claims, 7 Drawing Sheets

U.S. PATENT DOCUMENTS

| | | | |
|---|---|---|---|
| 6,691,701 | B1 | 2/2004 | Roth |
| 6,700,054 | B2 | 3/2004 | Cherney et al. |
| 6,843,573 | B2 | 1/2005 | Rabinowitz |
| 6,959,993 | B2 | 11/2005 | Gross et al. |
| 2002/0053214 | A1* | 5/2002 | Melendez-Gonzalez et al. .................. 62/235.1 |
| 2002/0179138 | A1* | 12/2002 | Lawheed .................... 136/246 |
| 2003/0070368 | A1* | 4/2003 | Shingleton ................. 52/173.3 |
| 2004/0074490 | A1* | 4/2004 | Mills et al. .................. 126/600 |
| 2004/0084077 | A1* | 5/2004 | Aylaian ...................... 136/246 |
| 2006/0283497 | A1 | 12/2006 | Hines |

OTHER PUBLICATIONS

Kurtz and Friedman, "Photovoltaics—Lighting the way to a Brighter Future," in Optics & Photons News, Jun. 2005, pp. 30-35.

* cited by examiner

RADIANT ENERGY CONVERSION SYSTEM

FIELD OF THE INVENTION

The present invention relates generally to radiant energy concentrating systems. More particularly, the invention relates to optical concentrators, collimators, and tracking devices that follow a radiant energy source to condense onto a collector such as a solar energy conversion device, or collimate and project a point source such as a light emitting diode to the target direction.

BACKGROUND OF THE INVENTION

The Photovoltaic (PV) industry is currently in rapid growth phase in the face of the unconstrained worldwide demand for energy and the deteriorating earth atmosphere caused by combustion emission gases. The supply of solar panels, dominated by polycrystalline silicon technology, is in severe shortage due to limited PV material supplies. Concentrator PV (CPV) systems have been recognized since 1950s for their significant reduction in the usage of precious PV materials by condensing sunlight to a cell that is up to 1000 times smaller than a non-concentrator system, therefore reducing PV material usage proportionally. As an added benefit, the energy conversion efficiency is enhanced considerably due to saturation of defects by free carriers at high flux levels. Efficient use of PV materials affords concentrator systems to incorporate multi junction PV cells with energy conversion efficiency more than twice that of silicon solar cells. However, for a concentration ratio of over 100, the acceptance angle of the optics is typically a few degrees. Therefore, the incidence axis of the collection optics has to be pointed directly towards the sun at all times during the day. In addition to this diurnal motion in the east-west direction, there is also a slower shift in the declination angle of the sun in the north-south direction, spanning 47° over a year. Thus, for systems with high concentration ratios, high precision tracking mechanisms on two orthogonal axes (or simply 2-axes) are required to follow the sun on daily and annual basis. At concentration ratio over 100, one-axis tracking is not practical, as it would require manual adjustments every few days.

Concentrator systems from prior art are based on either a heliostat design where a PV panel is mounted as the central receiver, or a radar dish design where PV panels with optics are mounted on a gimbal mechanism for two axes tracking. One axis tracking with seasonal adjustment is limited to lower concentrations, which do not justify system cost. Due to the harsh environment in the field, such as, but not limited to, wind, rain, dust and temperature cycles, the concentrator systems have to be made bulky and complex, and are therefore expensive to build, install, and maintain. Even with the recent development of flat plate CPV modules, each module contains a fixed array of micro concentrator assemblies, and the modules are still placed on a large tracking structure. Because of the bulky construction and complexity in maintenance, they are long believed to be unfit and unsightly for commercial or residential applications, especially for rooftop of homes. For utility installations, commonly thought of as the major application of CPV, the complexity and perceived risks under severe weather conditions made the acceptance of these flat plate CPV modules challenging. Attempts to lower the cost of ownership by reducing system size and minimizing impact of the environment were unsuccessful. As a result, concentrator PV systems have failed to reach commercial success beyond demonstration projects. Concentrator designs and history can be found in reviews by Swanson in *Prog. Photovolt. Res. Appl. Vol.* 8, 93-111, (2000), and more recently, by Kurtz and Friedman in *Optics & Photons News*, June 2005, pp 30-35.

In view of the foregoing, there is a need for a radiant energy concentrator system that has a large concentration ratio in terms of delivered energy per unit area, for example, without limitation, greater than 100, to remove the PV material bottleneck while justifying system cost. It would be further desirable if such a system is a low profile flat panel that is mounted on rooftops or simple support structures, has a tracking system hidden from view and isolated from wind, sand and moisture, allows for simple installation and low maintenance. A desirable feature of such a system is that it be suitable for high volume manufacturing processes such as, but not limited to, automation used in IC industry for low cost optics and panel assembly. For residential applications, the dark appearance of the conventional solar panels is unacceptable to some. It is therefore desirable to have panels that can be colored without loss of conversion efficiency. Additionally, architecturally pleasant multi functional systems that combine electricity generation, interior illumination, or air conditioning (heating/cooling) would accelerate the adoption of solar energy applications by the general public. Such a system would allow wide commercial applications of concentrator PVs for their superior energy conversion efficiency, low consumption of precious resources, and cost competitive to conventional energy sources.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3b shows the side view of an exemplary concentrator assembly shown in FIG. 3a. FIG. 3c shows a perspective view of the top pivot mechanism shown in FIG. 3a. FIG. 3d shows the top view of the top pivot mechanism shown in FIG. 3a;

FIGS. 4a and 4b show an exemplary configuration of a concentrator assembly, in accordance with an embodiment of the present invention.

FIGS. 5 and 6 show the side views of exemplary panel concentrator module systems where the primary optics are focusing reflective surfaces, in accordance with an embodiment of the present invention. FIG. 5 shows a module with a primary reflective surface.

FIG. 8 and FIG. 9 illustrate exemplary installations of panel concentrator modules on a rooftop, in accordance with an embodiment of the present invention.

Unless otherwise indicated illustrations in the figures are not necessarily drawn to scale.

SUMMARY OF THE INVENTION

To achieve the forgoing and other objects and in accordance with the purpose of the invention, a variety techniques for converting radiant energy are described.

Yet an aspect of the present invention is to provide a solar energy converter in a flat panel profile with high conversion efficiency and significantly lower usage of PV materials. It is still another aspect of the present invention that the tracking mechanism can withstand harsh environment in the field without maintenance, therefore achieving low cost and family friendliness. Yet another aspect of the present invention is to produce a panel design easily adaptable to high volume, low cost manufacturing processes such as, but not limited to, an automated assembly line. Another aspect of the present invention is to enable the appearance of any color as desired by consumers without loss of efficiency to broaden the adoption of solar technology. It is a further aspect that the system is aesthetically pleasant and provides multi functionality such as illumination, heating and cooling of buildings or houses. Yet, it is still a further aspect to design an apparatus that can collimate, combine and project the emission from an array of light emitting diodes towards a desired direction.

In one embodiment of the present invention an energy concentrator system is as follows. This embodiment comprises Panel Concentrator Modules (PCM), which comprises a housing with a transparent top window that isolates the components from the environment, an array of concentrator assemblies pivotally mounted on a two-axis tracking mechanisms, a photo sensor set and feedback sensor switches, A/D and D/A circuitry board, a set of non-tracking solar cells and power regulators that supply electronics and drive mechanisms. Each of the concentrator assemblies is comprised of primary and secondary optics, a PV chip mounted on a base plate with appropriate heat dissipation mechanisms. During the day, the concentrator assemblies follow the sunlight in unison, driven by the tracking mechanism, which is controlled by a central controller installed nearby. Power generated from each PCM is routed to main power line through an inverter, or to battery storage or hydrogen generator to store energy.

In another embodiment of the present invention a system is provided that can collimate, combine and project the emission from an array of light emitting diodes towards desired direction.

In yet other embodiments of the present invention means are provided that implement some or all of the foregoing functions.

Other features, advantages, and object of the present invention will become more apparent and be more readily understood from the following detailed description, which should be read in conjunction with the accompanying drawings.

DETAILED DESCRIPTION OF THE PREFERRED EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognized a multiplicity of alternate and suitable approaches, depending upon the needs of the particular application, to implement the functionality of any given detail described herein, beyond the particular implementation choices in the following embodiments described and shown. That is, there are numerous modifications and variations of the invention that are too numerous to be listed but that all fit within the scope of the invention. Also, singular words should be read as plural and vice versa and masculine as feminine and vice versa, where appropriate, and alternatives embodiments do not necessarily imply that the two are mutually exclusive.

The present invention will now be described in detail with reference to embodiments thereof as illustrated in the accompanying drawings.

It is to be understood that any exact measurements/dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

Figure 1A:
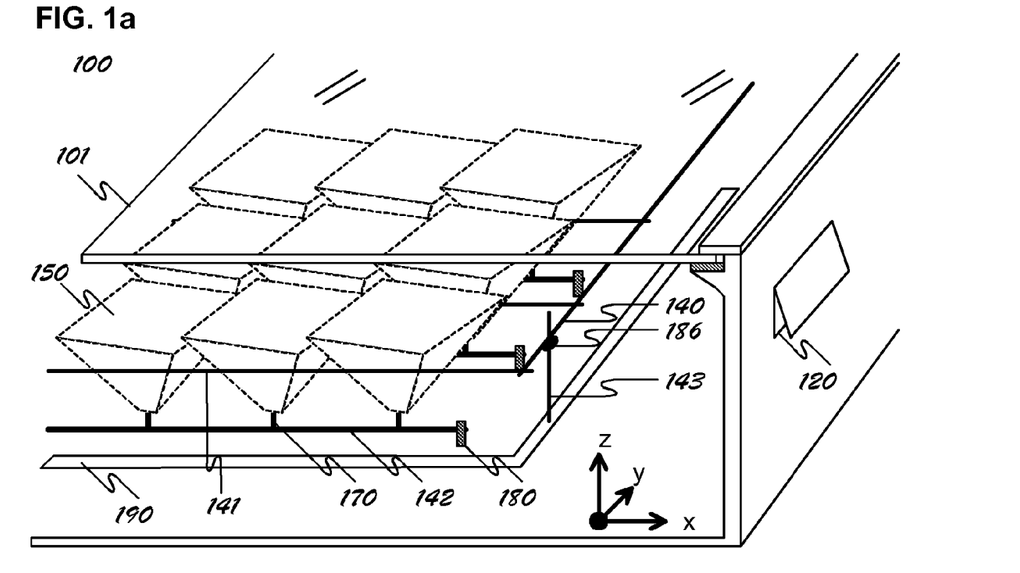
FIG. 1a shows a cross sectional view of an exemplary panel concentrator module system 100, in accordance with an embodiment of the present invention.
Figure 1B:
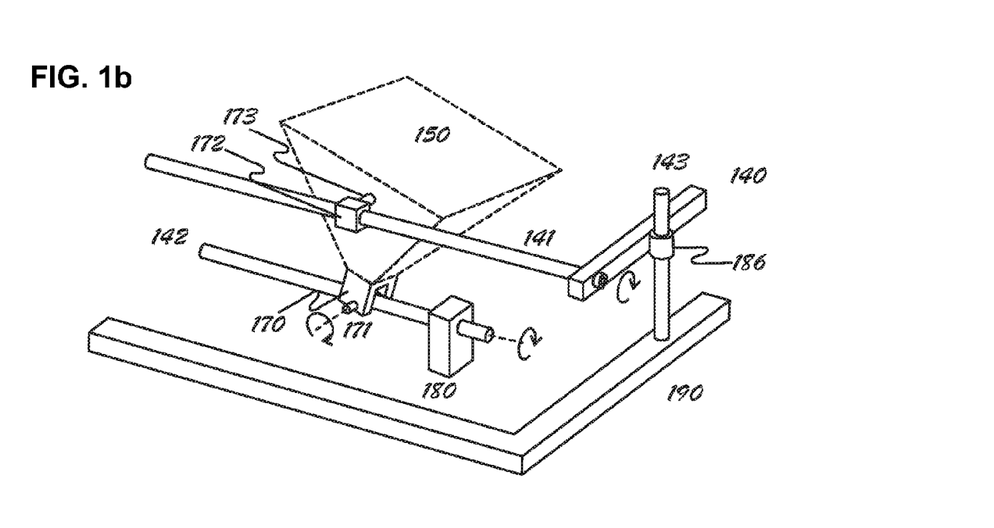
FIG. 1b shows a detailed view of an exemplary 2-axis rotation system from a panel concentrator module system, in accordance with an embodiment of the present invention.

FIG. 1*a* shows a cross sectional view of an exemplary panel concentrator module system, in accordance with an embodiment of the present invention. FIG. 1*b* shows a detailed view of an exemplary 2-axis rotation system from a panel concentrator module system, in accordance with an embodiment of the present invention. An array of concentrator assemblies 150 is sealed in an enclosure with a transparent top cover 101, preferably made of glass, however any durable, transparent material would be a suitable cover such as, but not limited to, plastic. The enclosure encapsulates the concentrator assemblies, the tracking mechanisms and electronics as described hereafter. To balance the internal pressure, a filter 120, or membrane, is installed on the side of the enclosure so that the contents are largely isolated from dust, wind and moist. In some embodiments, the enclosure may be hermetically sealed. In many practical applications of the present embodiment, the height of the module would be no higher than one meter, and preferably less than 0.3 meters to lessen impact by wind, reduce material usage and conform to a profile that is unobtrusive to the build structure. Concentrator assembly 150 is represented in the Figure by way of example, and not limitation, as a enclosure of a particular shape; however, those skilled in the art, in light of the teachings of the present invention, will readily recognize a multiplicity of alternative and suitable means for achieving the described functionality associated with concentrator assembly 150. Depending upon the needs of the particular application, the one enclosure may be provided for each concentrator assembly and/or one enclosure may be provided that contains all the concentrator assemblies. Due to mechanical and optical efficiency constraints, practical implementations of tracking on two independent axes are rather limited. Several drive mechanisms are detailed in the following descriptions to enable concentrator assemblies to accomplish 2-axis sun tracking in unison. These drive mechanisms are preferably made of metal, plastic, or a combination thereof, but other materials may be suitable, for example, without limitation, wood, etc.

In the present embodiment, each concentrator assembly 150 in a row is connected on one of its sides to a push rod 141 with a side joint 172. Rows of push rods 141 are linked to a lead frame 140 in a rotation-free manner. A tracking frame 190 sits on a linear x-y stage and is linked to lead frame 140 and push rods 141 through a set of vertical rods 143 and unions 186. In x- and y-directions, push rods 141 follow linear tracking frame 190 through 143. The height change of lead frame 140 and push rods 141 in the z-direction is accommodated by union 186, which may contain rollers for friction-free sliding. Those skilled in the art will recognize a multiplicity of alternate methods for allowing friction-free sliding of union 186 such as, but not limited to grease, bearings, etc. As tracking frame 190 moves in the y-direction, the assemblies in a particular row are propelled by that row's push rod 141 to rotate on an axle 142 around the x-axis. Axles 142 are supported on the ends by support struts 180. The rotation of concentrator assemblies 150 is aided by a side pivot 173 connecting concentrator assembly 150 to push rod 141 through side joint 172. As tracking frame 190 moves in the x-direction, push rods 141 lead concentrator assemblies 150 to rotation with a bottom joint 170 on a bottom pivot 171 around the local y-axis of each assembly, simply y-axis thereafter, which is orthogonal to x-axis. Rotation on the two orthogonal axes allow each assembly to track the diurnal motion of the sun in the east-west direction, as well as the shift in solar elevation in the north-south direction. A linear step of 0.1 mm by the x-y stage would correspond to ~0.06° in an angular adjustment for a rotation radius of 100 mm. Thus accurate 2-axes tracking can be conveniently achieved with the application of particular embodiments of the present invention. At 0.06° per step, the step motor (not shown) only rotates 250 turns a day for 180° tracking assuming 7.5° angle per step by the motor. A service life of 20-30 years amounts to 30-45 hrs of continuous running at 1000 rpm, a small wear-and-tear on the parts. Because the drive mechanism is protected from wind, dust and moisture, all components can be made simple. Some embodiments of the enclosure may be configured with a multiplicity of moisture absorbers to further reduce the ambient moisture level inside the enclosure. In the present embodiment, the light weight of system components and infrequent motor movement further lessens the power consumption of the step motors, which can be met conveniently with stationary solar cells using a pulse shaping circuitry when grid connection is not available. It will be apparent to those skilled in the art that there are necessary items omitted from the drawing such as, but not limited to, the 2 motors, drivers for the motors, A/D and D/A board, circuitry for power supplies, temperature sensors or switches, and sensor switches for hard limits.

Figure 4A:
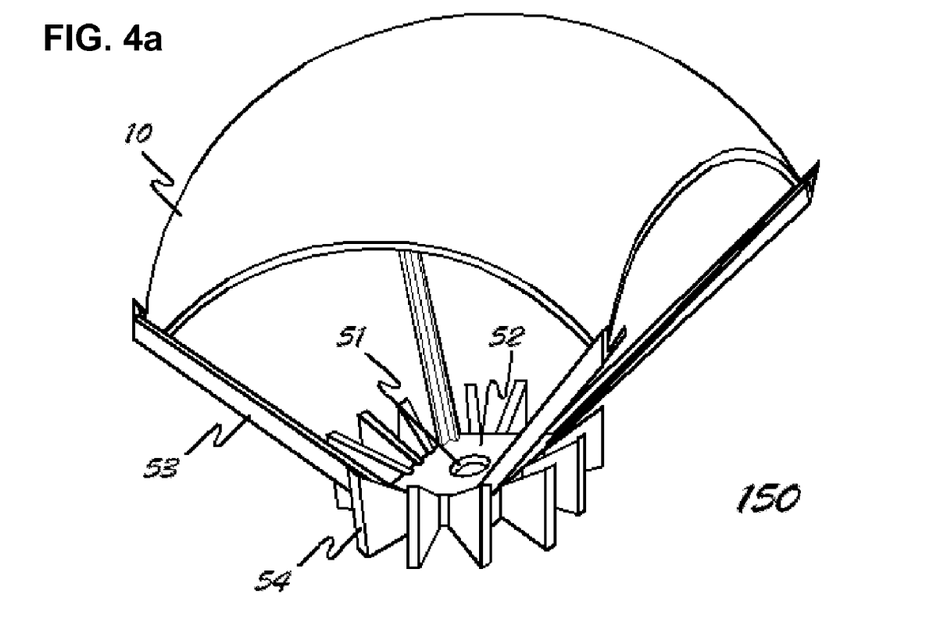
FIG. 4a shows a perspective view of the concentrator assembly.
Figure 4B:
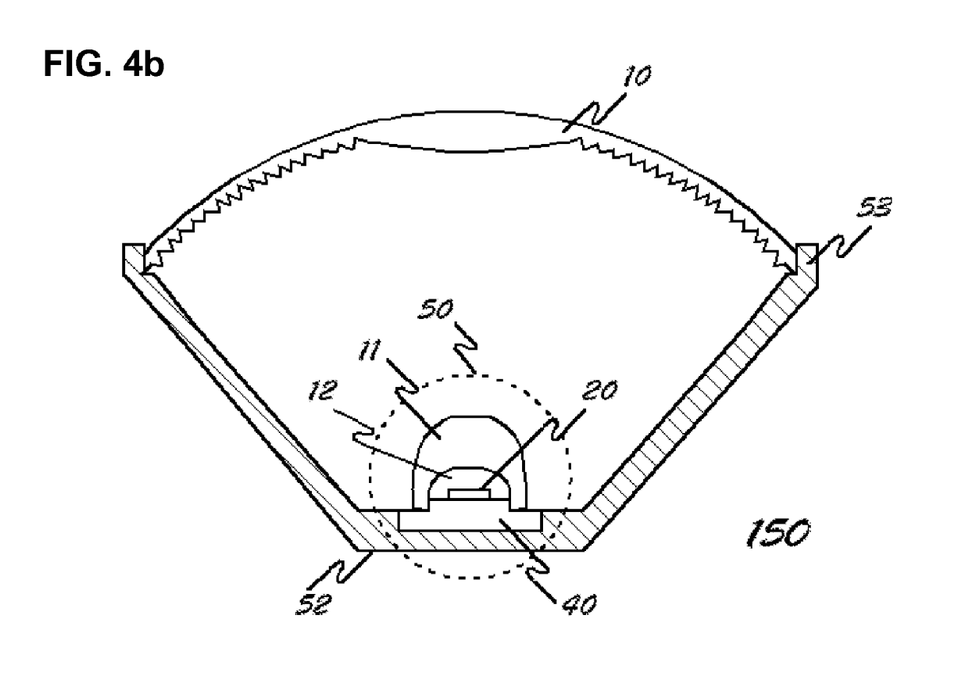
FIG. 4b shows a side cross sectional view of the concentrator assembly.

Unlike the traditional concentrator approaches where optics is fixed with respect to the array, the aspect ratio of concentrator assembly 150 in the present embodiment is restricted. To achieve 180° rotation for 12 hour tracking, adjacent rows of optics must be kept clear of each other's rotational path. From a simple geometric argument, this requires that concentrator assembly 150 and the rotation mechanisms, axle 142, bottom pivot joint 170 and bottom pivot 171 must be kept inside ⅙ of a pie, or a 60° span, when viewed along its rotation axis for daily tracking if no gap is allowed between optics for maximum surface coverage. Therefore, the focal length of the optics must be smaller than the width of the optics. For example, without limitation, for a flat Fresnel lens cut into a square shape, $f \leq 0.86\, w - h_c$, where f is the focal length, w is the width of the lens, and $h_c$ is the distance from PV cell to the bottom of the axle. Depending on the application of individual embodiments, this imposes a severe restriction on the choice of optics due to loss of transmission at small F-numbers defined as the ratio of focal length to the diameter of the optical aperture. With a gap, g, between the optics, the maximum permissible focal length is ~0.86 $w - h_c + g$. A dome shaped Fresnel lens, as shown in FIGS. 4a and 4b, offers more flexibility in optics design. Due to the dome shape, this type of lens takes advantage of the entire ⅙ of a pie and the F-number can be made as small as 0.25 without substantial penalty on optical transmission. When viewed from top, the dome shaped lens is cut into a square for maximum surface coverage, though rectangular shape is also acceptable for an appropriately designed PV cell. In alternate embodiments, a Total Internal Reflection (TIR) lens may also be used as the primary optics because of its small F-number. In general, Fresnel lenses are thin, light weight and made of plastics. They are economical and suitable for high volume manufacturing.

Figure 2A:
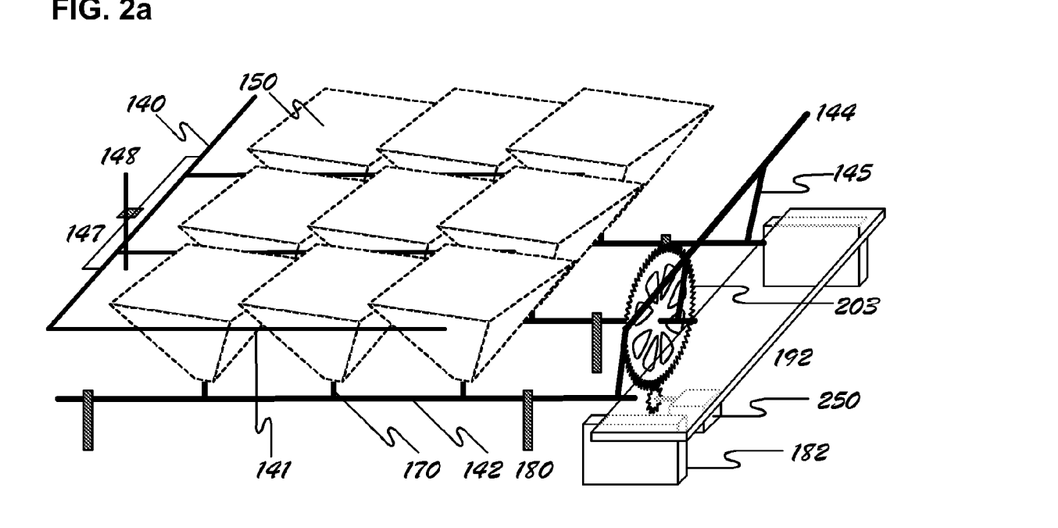
FIG. 2a shows a cross sectional view of an exemplary drive mechanism for concentrator assembly arrays, in accordance with an embodiment of the present invention.
Figures 2B, 2C, 2D:
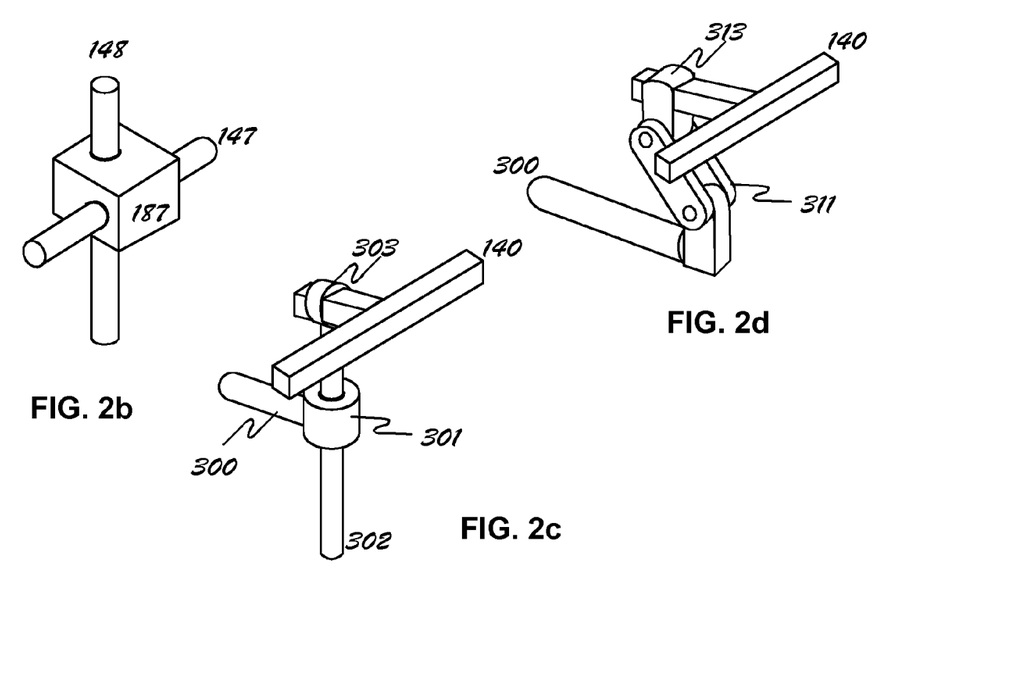
FIGS. 2b, 2c and 2d show three exemplary union mechanisms for concentrator assembly arrays, in accordance with an embodiment of the present invention.

FIG. 2a shows a cross sectional view of an exemplary drive mechanism for concentrator assembly arrays, in accordance with an embodiment of the present invention. FIGS. 2b, 2c and 2d show three exemplary union mechanisms for concentrator assembly arrays, in accordance with an embodiment of the present invention. In the present embodiment, x-axis rotation of concentrator assemblies 150 is accomplished by turning axles 142 from a gear set 203 through a handle 145 and a connecting bar 144. Rotation of concentrator assemblies 150 on the y-axis is realized by combining linear motion of a stage 192 in the x-direction with lead frame 140 and push rods 141 fixed in the x-direction. As stage 192 moves in the x-direction, sliding on stage supports 182, axle 142 slides through a support strut 180. Gear set 203, a motor and gear box 250, connecting bar 144, and handle 145 also slide in the x-direction. Since push rod 141 is fixed in the x-direction, each concentrator assembly 150 rotates on a bottom joint 170 around the assembly's y-axis. To accommodate the movement of concentrator assemblies 150 in the y- and z-directions, lead frame 140 is linked to a fixed post 148 through a cradle 147 and a union 187, as seen in detail in FIG. 2b. Alternatively, relative movement between concentrator assemblies 150 and axles 142 can also be achieved by moving 148 in x-direction while keeping 142 stationary. Using one of the exemplary mechanisms shown in FIG. 2c, or FIG. 2d, the rotation of concentrator assemblies 150 on the y-axis may also be realized through a linear motion of a linear drive rod 300 in the x-direction while axle 142 is fixed in the x-direction. Linear drive rod 300 and a motor (not shown) are attached on axle 142 to follow the rotation on the x-axis. Vertical motion of concentrator assemblies 150 during rotation along the y-axis is accommodated by a union mechanism exemplified by a vertical rod 302, collars 301 and 303 in FIG. 2c and a connector plate 311 and a pivot 313 in FIG. 2d. In these embodiments, rotation on the y-axis is achieved by a relative movement between concentrator assemblies 150 and axles 142, enabled by one of the union mechanisms shown in FIGS. 2b, 2c and 2d that accommodates both the rotation of concentrator assemblies 150 on the x-axis and the change in height as concentrator assemblies 150 rotate.

Figure 3A:
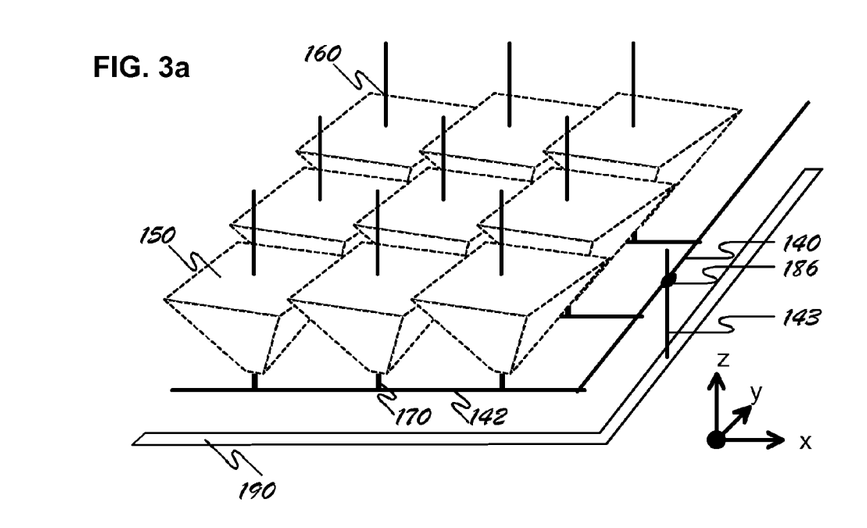
FIG. 3a shows the cross sectional view of an exemplary drive mechanism for concentrator assembly arrays, in accordance with an embodiment of the present invention.
Figure 3B:
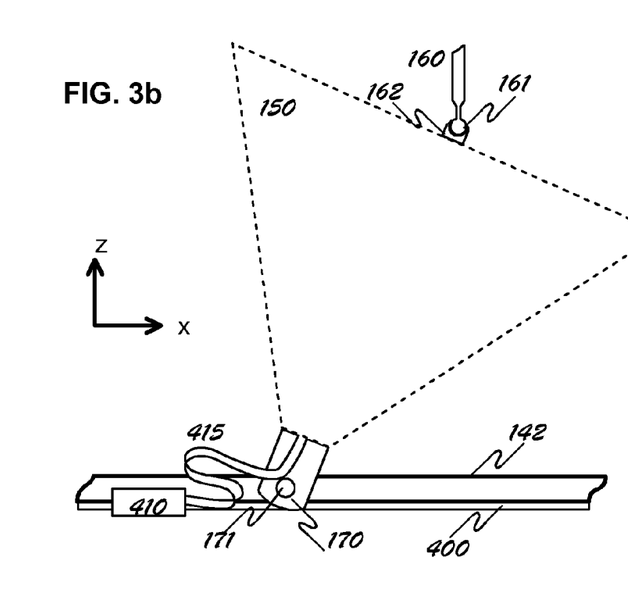
Figure 3C:
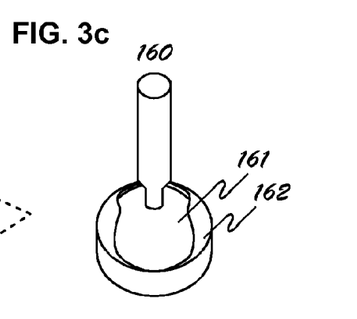
Figure 3D:
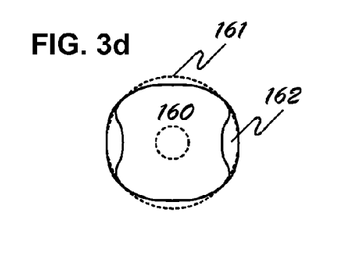

FIG. 3a shows the cross sectional view of an exemplary drive mechanism for concentrator assembly arrays, in accordance with an embodiment of the present invention. FIG. 3b shows the side view of an exemplary concentrator assembly shown in FIG. 3a. FIG. 3c shows a perspective view of the top pivot mechanism shown in FIG. 3a. FIG. 3d shows the top view of the top pivot mechanism shown in FIG. 3a. In the present embodiment side pivots 173, shown in FIG. 1b, on each concentrator assembly 150 may be replaced with a top pivot arm 160. Using top pivot 160, rotation is accomplished by the swing motion of push rods 142 driven by a stage 190 through a vertical rod 143, union 186 and lead frame 140 as described in FIG. 1a. In the present embodiment, a pivot ball 161 is secured with a ball socket 162, which is attached to the center top of the primary lens of concentrator assembly 150. To allow 12-hour daily tracking, the pivot should have 180° of rotational freedom in the east-west direction. On the other hand, tracking in north-south direction only needs 47° of rotation freedom. Therefore, as shown FIGS. 3c and 3d, ball socket 162 has a large opening in one direction for pivot ball 161 to rotate 180°, but a smaller opening in the orthogonal direction to form lips to secure pivot ball 161 and still allow it to rotate at least 47°. Additionally, a narrow neck is formed on the tip of the top pivot arm 160. For typical sizes of the primary lens, shadow loss associated with pivot arm 160, pivot ball 161 and ball socket 162 is less than one percent.

FIG. 3b also shows electrical connections. In the present embodiment, the power generated in a concentrator assembly 150 is carried out by flexible wiring 415 to a bus line 400 through a junction 410, which may comprise a bypass diode if there is none in the PV cell to protect the PV cell in shade. For electricity generation applications, concentrator assemblies 150 in a row are typically connected in series to boost voltage and minimize resistive loss in transmission line. The attained DC power is stored in batteries or is transmitted to the utility line through an inverter.

For a fixed stationary panel, the total solar flux on its top surface drops off in the form of cos θ, where θ is the incidence angle formed between the sunray and the normal of the panel surface. For the configurations in the above embodiments, this relation is manifested as a shadow effect when concentrator assemblies 150 are turned to face the incident sunlight at grazing angles. So long as the entire panel remains stationary, there is a flux reduction at grazing angles. Conventional concentrator systems avoid this problem by turning the entire panel towards the sun. In doing so it leads to an intrinsically bulky structure, subject to wind and other weather conditions. To increase the exposure at large angles, the assemblies are sometimes spaced apart. For example, without limitation, for a gap that is twenty percent of the width of the optics in east-west direction, the optics is shadow-free until the sun is 34° away from the panel's normal. The gap in north-south direction may be smaller than in east-west direction because the axis only spans 47° from summer to winter.

FIGS. 4a and 4b show an exemplary configuration of a concentrator assembly, in accordance with an embodiment of the present invention. FIG. 4a shows a perspective view of the concentrator assembly. FIG. 4b shows a side cross sectional view of the concentrator assembly. In the present embodiment, a primary optics 10 is affixed on four posts 53 of the base structure. At the focal plane is a base plate 52, which may be part of bottom pivot joint 170, shown in FIGS. 1a, 1b, 2a, 3a, 3b, and 6. Near the focal point, a PV device 50 is attached in a recess 51 using thermally conductive epoxy, or alternatively, using low temperature solder. For passively cooled systems, heat sink fins 54 are extruded from base plate 52 to dissipate heat from the energy conversion device. Both base plate 52 and heat sink fins 54 are preferably made of metal or other high thermal conductivity materials such as, but not limited to, ceramics, or composites of metal and ceramics. Heat generated by condensing sunlight can be passively dissipated in an appropriately designed concentrator system, as exemplified by a high power Light Emitting Diode (LED). A 1 mm$^2$ LED chip without active cooling can withstand >2 W with 30 years of lifetime. At a 500× concentration ratio, the solar power density on the chip for terrestrial applications is ~0.5 W/mm$^2$, a quarter of the power density in a LED Thus it is conceivable to build a reliable concentration system consisting of an array of small concentrators, each producing power of several Watts.

In the present embodiment, PV device 50 comprises a semiconductor PV chip 20, typically in the range of 1×1 to 10×10 mm$^2$, a lens cap 11, a filler 12, and a metal slug 40. PV chip 20 is 100 to 1000 times smaller than the size of primary optics 10. Although PV chip 20 may be of single crystalline Si solar cells with up to 25% conversion efficiency, which is significantly higher than the ~18% from polycrystalline Si solar cells, it is preferable to choose compound semiconductor based multi junction solar cells, such as, but not limited to, GaInP/GaAs/Ge based structures that boast conversion efficiency of greater than 37%. At high concentration ratios in the hundreds, the cost consideration of these chips is significantly alleviated. High efficiency reduces the cost per watt number for system components. In the present embodiment, PV chip 20 is preferably mounted on metal slug 40 using conductive epoxy (e.g., without limitation, silver based) or low temperature solder so that slug 40 also acts as an electrode. The top electrode, not shown in the sketch, is bonded to an electrically isolated pin through the metal holder or on the side. PV chip 20 is encapsulated in prefabricated lens cap 11 and filler 12 such as, but not limited to, transparent epoxy or silicone. Without lens cap 11, the intensity at the focal point can be highly non-uniform, mostly distributed within 100 μm spot size. It causes current crowding at the center of the chip, leading to severe resistive loss. It may also cause catastrophic failure at the hot spot, a situation much like holding a magnifying glass under the sun to focus on a piece of paper. Using Simultaneous Multiple Surface method, primary optics 10 and lens 11 can be designed to achieve smoother intensity distribution. In addition, a large lens cap 11 and filler 12 provide higher tolerance on tracking and focus errors, and better light coupling to PV chip 20 due to refractive index matching. In prior art, secondary optics are placed on the PV chip during panel assembly. In the preferred embodiment, PV device 50 is packaged as a two terminal device using microelectronic packaging technology, which can be automated for high yield and high volume manufacturing, similar to an LED packaging process.

The simplest tracking control is achieved by a time-based tracking. In the present embodiment, the tracking controller box contains a microprocessor, a flash memory card or the likes, and an accurate clock. Although it is feasible that each panel concentrator module contains a tracking controller, it is preferred that the tracking controllers are shared by a number of panels in an installation, therefore costs little on a per-watt basis. Currently, microprocessors and memory cards are sufficiently powerful to handle all the panels in a small installation such as at a residential site. The coefficients of all formulas and the calibration data and limits for each panel as well as tabulated error data for the position of the sun, for example, without limitation, the popularly adopted formula for the declination angle may cause up to 0.4° errors in tracking, are stored in the flash memory. The clock can be simply based on a high quality quartz crystal. Alternatively, it can be a wireless receiver that regularly receive time update from a remote source, which can be radio based, such as, but not limited to, the Colorado WWVB radio station, or from a local wireless network, or from satellite broadcast. All of the receiver based clocks retain the accuracy of an atomic clock. The microprocessor calculates and times the next pulse for the step motor driver to track the sun's movement.

The orientation of a panel may endure minor changes over time, for example, without limitation, after an earthquake or major storms; therefore each panel needs to be calibrated periodically. To maximize solar energy conversion and increase system fault tolerance, a built-in angle optimizer using an Optical Sensor Set (OSS) is adopted in the preferred embodiment along with the time based system. The construction of an OSS is known to those skilled in the art. Since the location of the sun is highly predictable and the optics in an OSS is sensitive to small deviations, the angular calibration of a panel can be accurately determined. The microprocessor reads and stores hourly readouts from the OSS to find when sufficient direct sunlight is present, when photocurrent is sufficiently high and the differential signals are large. The microprocessor then calculates the calibration and stores them for future use and also for history log. The OSS may also alert the owner, with the flash of an LED light, for example, without limitation, if the calibration data are too far off from the original data or when the actual power generated is inconsistent with the OSS calibration. The OSS could also function as a crude time calibration unit when sufficient errors accumulate in the clock or when the wireless source goes out of service by providing the location of the sun at regular intervals. The OSS will not be in use under conditions when its readings are unreliable such as, but not limited to, during cloudy hours or smoggy days, or when obstructed on the top window, for example, without limitation by shadow or debris. The application of a fail-safe design such as, but not limited to the OSS and time bases system described above will help to ensure uninterrupted operation of the system. The microprocessor also records other crucial information such as daily average power of each panel so that it can alert the owner for issues such as, but not limited to, accumulation of debris.

In the preferred embodiment the controller box is installed in a location subject to less severe weather conditions. When connection to a power grid is unavailable, the system can be powered with the non-concentrator solar cell inside each panel. Alternatively, it can be powered with a separate small non-tracking solar panel. Each morning, the microprocessor wakes up after it receives sufficient power. The microprocessor checks the time and carries out diagnostic tasks and preparation tasks such as, but not limited to, turning on heaters for the motors if necessary to reach appropriate operating temperature and waiting for sufficient power to run motors. In the worst case scenario, if the sunlight goes out completely, for example, without limitation, during a moving storm, the system will shut down and restart after the sunlight comes out again. When the microprocessor senses situations that the stepper might be physically out of calibration, such as, but not limited to, finding large discrepancies between the OSS and actual power from the concentrators, the microprocessor goes through a stepper calibration procedure where hard limit switches are used to physically reposition the tracking system to an approximate known orientation. Further fine-tuning is achieved using the OSS as described earlier. Before the end of a tracking day, the microprocessor goes through a sleep procedure to park each axis to its home position. A smart tracking controller disclosed in the above embodiments improves its fault tolerance level in real world applications.

Figure 5:
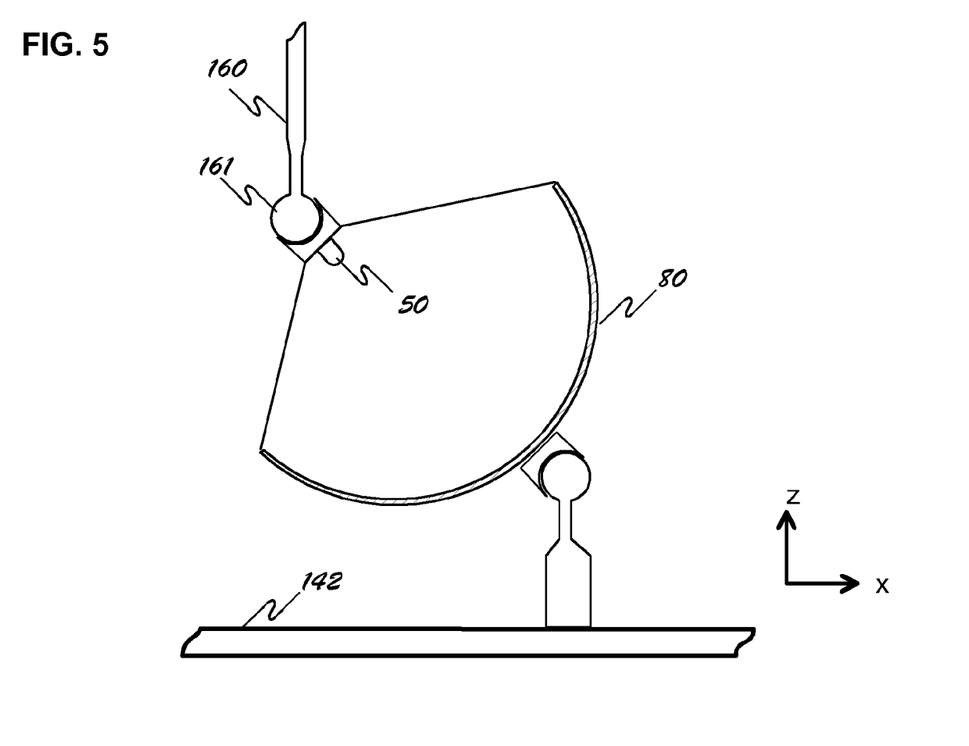
Figure 6:
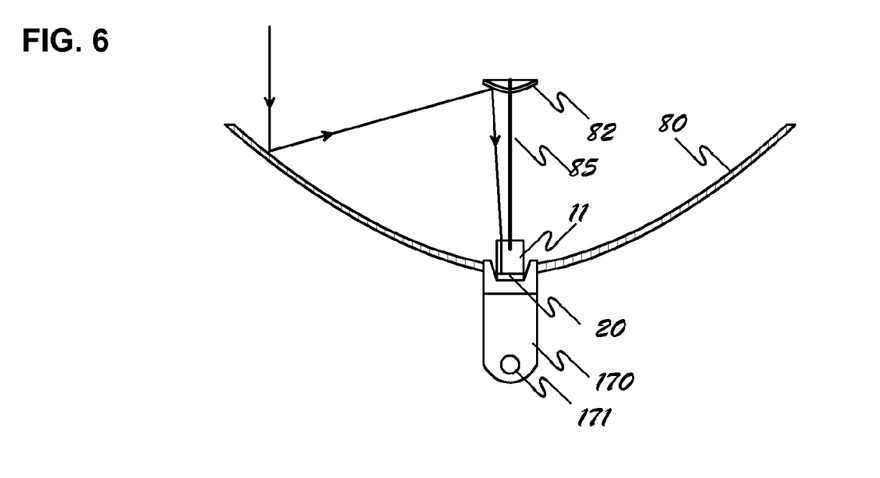
FIG. 6 shows a module with a primary and a secondary reflective surface.

FIGS. 5 and 6 show the side views of exemplary panel concentrator module systems where the primary optics are focusing reflective surfaces, in accordance with an embodiment of the present invention. FIG. 5 shows a module with a primary reflective surface, and FIG. 6 shows a module with a primary and a secondary reflective surface. In the embodiment shown in FIG. 5, a primary reflector 80 is positioned below a PV device 50 with the reflective side of primary reflector 80 facing the sun. A top pivot arm 160 and a top pivot ball 161 remain affixed, while primary reflector 80 tracks the sunlight through a rotation, which moves in swing motion around top pivot 161. The electrical wiring in the present embodiment is above the primary optics and, therefore, casts a shadow on the optics. An alternative embodiment, shown in FIG. 6, is to use a secondary reflector 82 near the focal point of primary reflector 80 to bring condensed light downwards towards lens cap 11 of PV cell 20, which can now sit behind primary reflector 80. In this embodiment, PV cell 20 may be integrated into bottom pivot joint 170, as explained in FIGS. 3a and 3b. Secondary reflector 82 may be supported by a thin glass rod 85. This arrangement minimizes the shadow loss from the electrical wiring and the support beams. In alternate embodiments primary reflector 80 and secondary reflector 82 may be of a refractive material instead of a reflective material, for example, without limitation, a prism.

Figure 7:
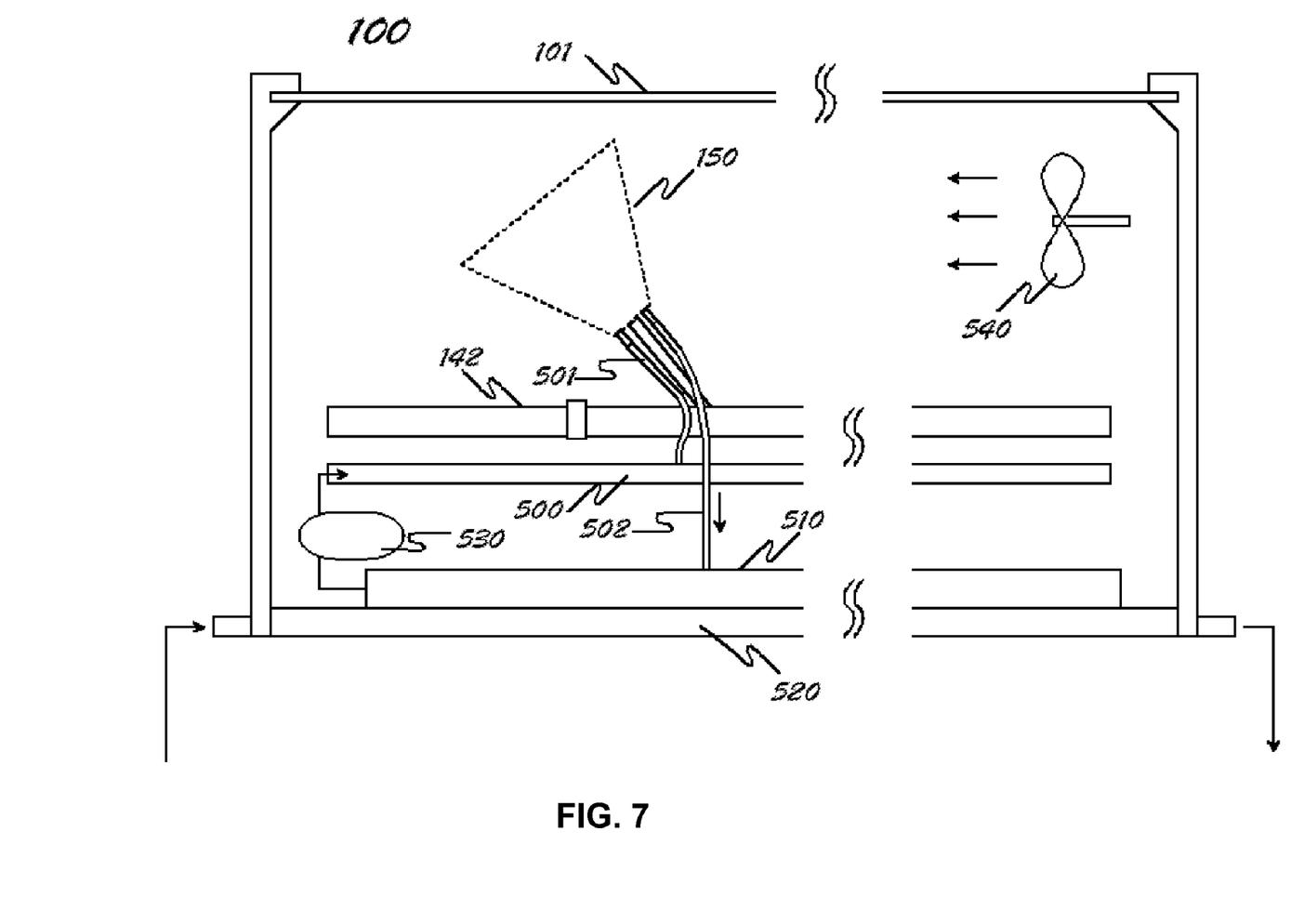
FIG. 7 illustrates an exemplary panel concentrator module system including a cooling system and heat exchanger, in accordance with an embodiment of the present invention.

FIG. 7 illustrates an exemplary panel concentrator module system including a cooling system and heat exchanger, in accordance with an embodiment of the present invention. For rooftop applications, where the back panel does not need to be transparent, a heat exchanger 510 can be constructed at the bottom of the chamber to heat a water reservoir in the house or to pass the heat to an absorption chiller to cool the interior of the building. The diffused light does not get absorbed in the concentrator PV chips. More importantly, a significant portion of the light absorbed by the solar cell is exhausted as heat. For example, with a 30% PV chip, over 50% of the sunlight becomes heat. In the present embodiment, a close-loop cooling line 500 is attached to the bottom of the concentrator base plate, under axle 142, through two small flexible hoses 501 and 502 for the inlet and outlet. A small built-in pump 530, powered by the concentrator PV chip, circulates the coolant to remove heat generated by the PV chips. The hot liquid returns through outlet 502 to heat exchanger 510, which, with proper structure and surface treatment, also absorbs diffused light and heat from the air. A small fan 540 is added to circulate hot air to heat exchanger 510. The heat is passed on to house water through the bottom half of the exchanger 520 and stored in a tank for household use. The array of concentrator assemblies 150 softens out the unpleasant appearance of the solar heater, which is blackened for better efficiency, while heat removal from the concentrator base plate helps the power efficiency of the PV chips.

Figure 8:
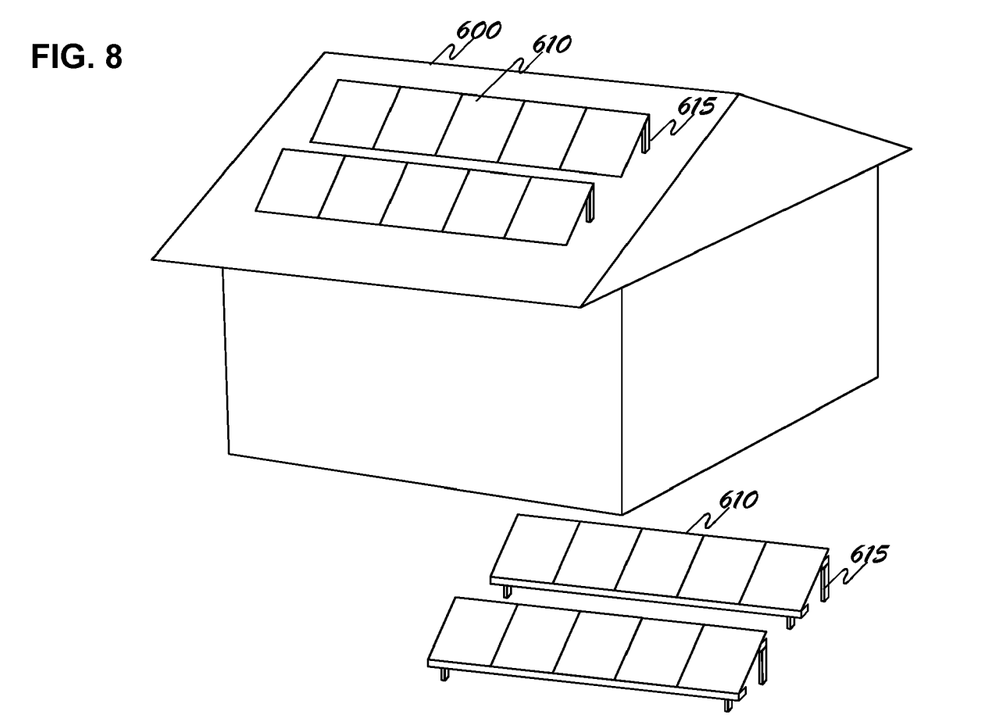
Figure 9:
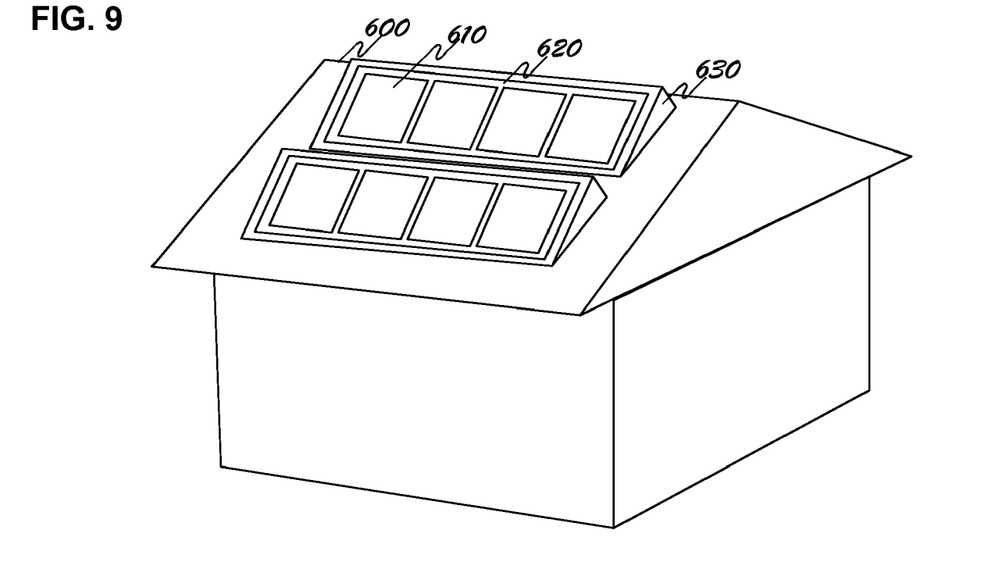
FIG. 9 shows an installation using a vinyl frame 620.

FIG. 8 and FIG. 9 illustrate exemplary installations of panel concentrator modules on a rooftop, in accordance with an embodiment of the present invention. In common applications in the field, the panel concentrator modules 610 are mounted stationary on top of a roof or installed in an open space on a support structure in a solar farm as shown in FIG. 8. The top surface of the panel concentrator modules faces at an angle due south. The angle between the panel faces to the ground normally is the same as the slope of the roof for rooftop installation. However, for optimal energy conversion, the panel can be tilted using an optional support structure 615 according to the latitude angle of its location. On equinox, March 21 and September 21, the panel faces exactly to the incoming sunlight at prime meridian. Since concentrator assemblies do not focus diffused sunlight, FIG. 9 depicts a skylight installation to take advantage of this form of light, which is pleasant to the eyes. The panel concentrator modules are mounted in vinyl frame 620, which is part of a skylight 630, much like the dual pane window installation. Since some of the diffused light gets bounced back, the panels appear translucent or carry the color of the enclosure and the tracking structure. Since diffused or scattered photons are not efficiently collected by the optics, they add aesthetic value to the building or landscape without affecting electricity conversion efficiency.

Although at least some the foregoing embodiments were described a two axis pivoting system, alternative embodiments of the present invention may instead implement any suitable rotational degrees of freedom (e.g., without limitation, one, or more than two) for the needs of the particular application. Similarly, even though at least some the foregoing embodiments were described in terms of orthogonal axis of rotation, alternative embodiments of the present invention may instead implement any suitable rotational axis, some or all of which may be mutual not orthogonal. Some contemplated exemplary applications where having at least some non-orthogonal rotational axes might be, without limitation, to provide the system more failure robustness, where if one axis fails, a non-orthogonal rotational axis might be able to still provide adequate tracking in that failed rotational dimension. Moreover, other embodiments of the present invention, beyond those shown in the Figures, may implement any number of energy concentrator assemblies including just one.

Having fully described at least one embodiment of the present invention, other equivalent or alternative methods of implementing a panel concentrator module system according to the present invention will be apparent to those skilled in the art. For example, without limitation, the step motors may be replaced with a hydraulic system or pneumatic system where circular motion of the push frame is accomplished by the linear motion of a cylinder around a pivot point under fluidic or pneumatic pressure. By way of further example, and not limitation, a multiplicity alternative embodiments and variations are contemplated as follows. Gears in FIG. 2a can be replaced with pulleys. There can be more than one motor for each axis of rotation to improve system robustness at the expense of more motors used. The union mechanisms and the rigid push rods disclosed in FIGS. 1-3 can be replaced with flexible lines protected in sleeves so that the push mechanisms are not blocking rotation in the other axis. It is also conceivable to replace the mechanical driving force with electromagnetic forces to rotate rows of assemblies without hindering rotation in the other axis. Two-axis rotation of the assemblies may also be achieved using at least one robotic adjustor which can travel along rows of assemblies and adjust rotation angle of one axis at a time, or both axes at once, or one axis of an entire row at a time without being blocked by adjacent assemblies. The arrangement of the assembly array may also be arranged in patterns other than illustrated in FIGS. 1-3, for example, as a closed packed hexagonal array. The primary lens may be cut in other shapes such as truncated rectangle or hexagon. The primary lens can be a silicone TIR lens as those used in prior art, or a plastic Plano-convex or double-convex, which improves on focusing error at the expense of higher weight and usage of materials. When the PV device is replaced with a broad angle light source, such as an LED, the system works as a projector. The projected light can be directed or scanned. All the foregoing alternative embodiments and variations are, thus, likewise contemplated as being within the scope of the present invention. The invention has been described above by way of illustration, and the specific embodiments disclosed are not intended to limit the invention to the particular forms or components disclosed therein. The invention is thus to cover all modifications, equivalents, and alternatives falling within the spirit and scope of the following claims.

What is claimed is:

1. A high-efficiency solar energy skylight, comprising:
   a roof-mounted window having a glass portion and a frame, the window, the glass portion and the frame forming an enclosure that is disposed in a fixed position relative to a roof of a structure in which the roof-mounted window is located;
   a plurality of concentrator assemblies disposed in an array within the enclosure, each concentrator assembly of the plurality of concentrator assemblies comprising: a photovoltaic chip;
      an optics for concentrating a solar energy onto the photovoltaic chip;
      a base for supporting the optics and the photovoltaic chip, the base including a base plate for positioning the photovoltaic chip in the path of the concentrated solar energy from the optics;
      a bottom joint pivotally attached to a lower portion of the concentrator assembly; and
      an upper joint pivotally attached to an upper portion of the concentrator assembly;
   a two-axis tracking mechanism disposed within the enclosure, the tracking mechanism including a lead frame connected to the upper joint of each concentrator assembly of the plurality of concentrator assemblies and an axle connected to the bottom joint of each concentrator assembly of the plurality of concentrator assemblies, the tracking mechanism movable in a first direction and a second direction to provide an x-axis of rotation and a y-axis of rotation for each concentrator assembly among the array, the tracking mechanism functions to provide a concerted movement of each concentrator assembly of the plurality of concentrator assemblies in the array, the concerted movement of each concentrator assembly of the plurality of concentrator assemblies in the array configured to maximize the solar energy collected by moving the optics of each concentrator assembly of the plurality of concentrator assemblies in a range of up to 180° in the x-axis of rotation and at least 47° in the y-axis of rotation; and
   a heat extraction system to collect and convert an unused solar energy from heat into a useful energy, wherein the heat extraction system comprises a heat exchanger, a heat extraction line operably attached to the heat exchanger and a base plate of one of the concentrator assemblies, and a coolant in fluid communication with the base plate and the heat exchanger to transport heat from the base plate to the heat exchanger through the heat extraction line as the useful energy; wherein the solar energy skylight is sized and configured to allow part of incident light entering the skylight to be used for energy production and part of the incident light entering the skylight for illumination of an interior portion of the structure.

2. The skylight of claim 1, wherein each solar concentrator assembly among the array comprises a maximum focal length between the optics and the photovoltaic chip is about 0.86 $w - h_c$, where w is the width of the optics, and $h_c$ is the distance between the photovoltaic chip and the bottom joint.

3. The skylight of claim 1, wherein the tracking mechanism operates on time-based tracking and an optical sensor for calibration and recalibration of the time-based tracking.

4. The skylight of claim 1, wherein the tracking mechanism operates on time-based tracking and an optical sensor for calibration of the time-based tracking, wherein the tracking system is controlled remotely from a controller box, and the optical sensor functions as a backup tracking control upon a failure of the time-based tracking mechanism and/or remote control.

5. The skylight of claim 1, further comprising a support structure for tilting the skylight in position relative to the roof.

6. The skylight of claim 1, wherein a gap, g, exists between the concentrator assembly optics of adjacent concentrator assemblies in the array to minimize a shadow effect in the array during the tracking and maximize energy converted by the skylight; and wherein the maximum focal length between the optics and the photovoltaic chip is 0.86 w−$h_c$+g.

7. The skylight of claim 1, wherein the concentrator assemblies are aligned in a plurality of rows and a plurality of columns within the enclosure.

8. The skylight of claim 1, wherein the enclosure protects the plurality of concentrator assemblies and the tracking mechanism during use because the concentrator assemblies and tracking mechanism are disposed within the enclosure.

9. The skylight of claim 1, wherein the height of the enclosure is less than 0.3 meters.

10. The skylight of claim 1, wherein the interior of the enclosure has a preselected color that adds a desired color to the system when carried back through the transparent top cover in the form of diffused light.

11. A skylight for a radiant energy conversion system, the skylight comprising:
an enclosure mounted in a fixed position relative to a structure, the enclosure including a top window that allows incident light to pass through;
a plurality of concentrator assemblies disposed within the enclosure, the plurality of concentrator assemblies disposed in an array, each concentrator assembly of the plurality of concentrator assemblies rotatable in a first direction and in a second generally orthogonal direction within the enclosure, each concentrator assembly of the plurality of concentrator assemblies comprising:
optics for concentrating solar energy;
a photovoltaic chip;
an upper pivot connector connected to an upper portion of the concentrator assembly; and
a lower pivot connector connected to a lower portion of the concentrator assembly; and
a tracking mechanism disposed within the enclosure for moving each concentrator assembly of the plurality of concentrator assemblies in the first direction and in the second direction, the tracking mechanism comprising:
a lead frame connected to the upper pivot connector of each concentrator assembly of the plurality of concentrator assemblies to rotate the concentrator assemblies in the first direction; and
an axle connected to the lower pivot connector of each concentrator assembly of the plurality of concentrator assemblies to rotate the concentrator assemblies in the second direction;
wherein the skylight is sized and configured to allow part of the incident light to be used for energy production and part of the incident light to be used for illumination of an interior portion of the structure.

12. The skylight as in claim 11, wherein the upper pivot connector of each concentrator assembly of the plurality of concentrator assemblies comprises a side joint and a side pivot disposed along a side of the concentrator assembly.

13. The skylight as in claim 11, wherein the lower pivot connector of each concentrator assembly of the plurality of concentrator assemblies comprises a bottom joint and a bottom pivot connected to a lower portion of the concentrator assembly.

14. The skylight as in claim 11, wherein when the tracking mechanism moves in a y-direction, each concentrator assembly of the plurality of concentrator assemblies rotates about an x-axis.

15. The skylight as in claim 11, wherein when the tracking mechanism moves in an x-direction, each concentrator assembly of the plurality of concentrator assemblies rotate about the lower pivot connector.

16. The skylight as in claim 11, wherein the tracking mechanism moves each concentrator assembly of the plurality of concentrator assemblies in unison.

17. The skylight as in claim 11, wherein a gap is disposed between adjacent concentrator assemblies of the plurality of concentrator assemblies to allow each concentrator assembly to rotate in the first direction and in the second direction; and
wherein the gap between adjacent concentrator assemblies of the plurality of concentrator assemblies is sized and configured to maximize energy production.

18. The skylight as in claim 11, wherein the enclosure encapsulates the concentrator assemblies and the tracking mechanism to shield the contents from the environment.

19. The skylight as in claim 11, wherein the enclosure is mounted in a fixed position relative to a skylight in a roof of the structure and the enclosure does not move relative to the roof.

20. The skylight as in claim 11, wherein the enclosure forms at least a portion of a skylight in a roof of the structure and the enclosure does not move relative to the roof.

21. The skylight as in claim 11, wherein a portion of the light passing through the top window of the enclosure passes through the concentrator assemblies and provides light to the interior portion of the structure.

22. The skylight as in claim 11, wherein a portion of the light passing through the top window of the enclosure passes through the concentrator assemblies and provides indirect light to the interior portion of the structure.

23. The skylight as in claim 11, wherein the tracking mechanism simultaneously moves each concentrator assembly of the plurality of concentrator assemblies in the array.

24. The skylight as in claim 11, wherein the optics of each concentrator assembly of the plurality of concentrator assemblies comprises a primary concentrator and a primary reflector.

25. The skylight as in claim 11, wherein the upper pivot connector comprises a pivot point disposed at least proximate a top center location of each concentrator assembly of the plurality of concentrator assemblies and a pivot arm connected to each pivot point.

26. The skylight as in claim 11, wherein the enclosure is sealed and a filter allows an internal pressure to balance with an external pressure while filtering out particulates and moisture.

27. The skylight as in claim 11, further comprising a plurality of rods connecting the lead frame and the tracking mechanism.

28. The skylight as in claim 11, further comprising a support connected to the axle, the support allowing rotational movement of the axle.

29. The skylight as in claim 11, wherein a size of the gap between adjacent concentrator assemblies of the plurality of concentrator assemblies is minimized in the first direction and in the second direction to maximize power output of the radiant energy conversion system.

30. The skylight as in claim 11, wherein the tracking mechanism provides integrated movement of the concentrator assemblies in the first direction and in the second direction.

31. The skylight as in claim 11, wherein the size of the gap between adjacent concentrator assemblies of the plurality of concentrator assemblies is sized and configured to maximize the light entering the optics of each concentrator assembly of the plurality of concentrator assemblies.

32. The skylight as in claim 11, wherein each concentrator assembly of the plurality of concentrator assemblies are disposed in a generally planar array.

33. The skylight as in claim 11, wherein the radiant energy conversion system simultaneously forms a skylight for the structure and generates energy.

34. The skylight as in claim 11, wherein the plurality of concentrator assemblies are sealed within the enclosure.

35. The skylight as in claim 11, wherein the gap between adjacent concentrator assemblies in the array is sized and configured to maximize capturing of light entering the enclosure.

* * * * *